US006247940B1

(12) United States Patent
Norte

(10) Patent No.: US 6,247,940 B1
(45) Date of Patent: Jun. 19, 2001

(54) CONNECTOR HAVING IMPROVED HIGH-VOLTAGE SURGE PERFORMANCE

(75) Inventor: David A. Norte, Westminster, CO (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/379,498

(22) Filed: Aug. 23, 1999

(51) Int. Cl.$^{7}$ .............................. H01R 12/00; H05K 1/00
(52) U.S. Cl. .............................. 439/79
(58) Field of Search .............................. 439/79, 876; 361/773; 257/692, 734

(56) References Cited

U.S. PATENT DOCUMENTS 4,209,798 * 6/1980 Beretta ................................ 257/666
4,506,238 * 3/1985 Endoh et al. ........................ 333/138
4,807,087 * 2/1989 Sawaya ................................ 361/773
5,096,428 * 3/1992 Lwee et al. ............................ 439/79
6,015,316 * 1/2000 Matsubara ............................ 439/736

* cited by examiner

*Primary Examiner*—Brian Sircus
*Assistant Examiner*—Brian S. Webb
(74) *Attorney, Agent, or Firm*—John C. Moran

(57) ABSTRACT

The high-voltage surge performance of a Centronic connector (100) is improved through increasing the free-air distance (120', 120") between adjacent pins (102', 102") by tapering the portions of pin bodies (301', 301") that extend outwardly from the insulating molding (101) of the connector. The bodies may taper either monotonically (FIG. 5) or concavely (FIG. 7). Additional improvement is obtained by extending the tapered pin-body portions into the molding (FIG. 6) and/or by making the molding with ribs (800) that extend outwardly between adjacent pins (FIG. 8) or by thickening the molding.

4 Claims, 2 Drawing Sheets

CONNECTOR HAVING IMPROVED HIGH-VOLTAGE SURGE PERFORMANCE

TECHNICAL FIELD

This invention relates to the configuration of electrical connectors.

BACKGROUND OF THE INVENTION

Myriads of designs exist for electrical connectors. Most include a plurality of closely-spaced contacts for connecting to individual conductors of electrical signals. Many of these connector designs have become de jure or de facto standards for different applications. A representative of such a connector is the communications industry-standard Centronic connector, which mounts on printed circuit leads of a circuit board and connects the circuit board to off-board multi-lead cables.

Equipment in which such connectors are typically used must often pass rigorous electrical tests before it can be sold. For example, telecommunications equipment in which the Centronic connector is used to connect to external communications lines must in many countries pass a high-voltage surge test wherein the conductors of the connector must withstand a 1 KV surge signal without arcing (shorting) to adjacent conductors. The connector is designed to pass such foreseen tests.

Unfortunately, some jurisdictions have seen fit to impose more stringent tests over time. For example, some jurisdictions now require the above-mentioned telecommunications equipment to pass a 1.5 KV high-voltage surge test. Such tests were not foreseen and therefore not taken into consideration in the design of the connector, with the consequence that the connector does not pass this test. Of course, one can redesign the connector to pass the test, e.g., by increasing the spacing of the connector's conductors, or one can substitute a different kind of connector that is robust enough to pass the test. But the use of such different, non-standard, connectors would destroy the equipment's compliance with the industry standards and would also require the use of non-standard external telecommunications connectors that would subsequently attach to these non-standard connectors.

SUMMARY OF THE INVENTION

This invention is directed to meeting these needs and solving these problems of the prior art. Generally according to the invention, a standard connector is modified in such a way that it meets more stringent high-voltage surge tests, yet still complies with the industry-standard specification for that connector. This is achieved through increasing the free-air distance between adjacent conductors ("pins") of the connector by modifying their shape but without changing their size, position, or separation.

Specifically, according to the invention, in a connector that has an insulating molding and a plurality of conductive pins extending from the molding, each pin has a base that extends partly out of the molding with a leg of the pin narrower than the base in that portion extending from the base. The base tapers to the leg along an entire length thereof between the leg and the molding. The taper may be monotonic or concave. Preferably, the tapered portion of the base extends into the molding. Also preferably, the molding defines ribs that extend outwardly therefrom between adjacent pins.

These and other features and advantages of the invention will become evident from the following description of an illustrative embodiment of the invention considered together with the drawing.

DETAILED DESCRIPTION

Figure 1:
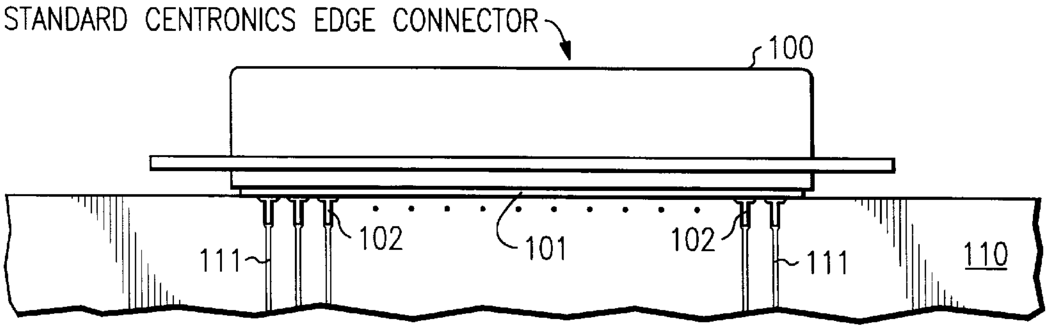
(PRIOR ART) FIG. 1
FIG. 1 is a side view of a conventional Centronic connector.
Figure 2:
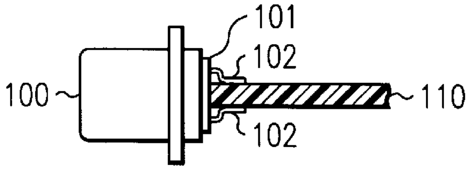
(PRIOR ART) FIG. 2
FIG. 2 is an end view of the connector of FIG. 1.

FIG. 1 shows a side view and FIG. 2 shows an end view of a standard Centronic connector 100. Connector 100 includes an insulating (plastic) molding 101 through which extend two rows of a plurality of pins 102. Connector 100 mounts on an edge of a printed circuit (PC) board 110. The two rows of pins 102 straddle the edge of PC board 110 and connect to printed leads 111 of PC board 110 with one row of pins 102 on each face of PC board 110.

Figure 3:
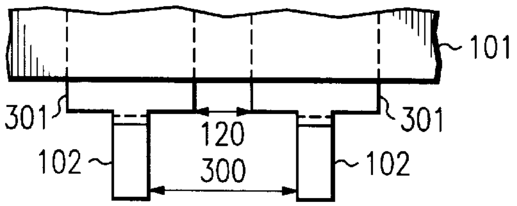
(PRIOR ART) FIG. 3
FIGS. 3 and 4 are top views of two conventional embodiments of adjacent pins of the connector of FIG. 1.
Figure 4:
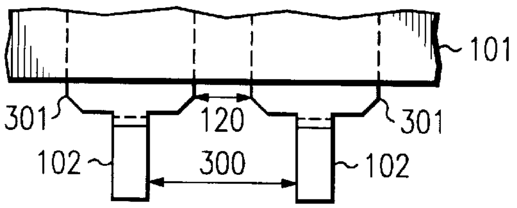
(PRIOR ART) FIG. 4

FIGS. 3 and 4 show a top view of two adjacent pins 102 in more detail. Each pin 102 is made from a sheet of metal. It includes a wider base 301 which extends through and out of molding 101, and a narrower leg 300 which extends from base 301 and connects pin 102 to a PC lead 111 by being soldered thereto. Pins 102 are evenly spaced from each other, and the shortest distance between them is distance 120 between their bases 301. Bases 301 typically are rectangular as shown in FIG. 3, or rectangular-chamfered as shown in FIG. 4.

During a high-voltage surge test, it is free-air distance 120 between adjacent pins 102 that determines what voltage pins 102 can withstand without arcing. (The distance between pins 102 within molding 101 is not critical, because molding 101 is a better insulator than air.) Therefore, to increase the voltage that pins 102 can withstand without arcing, it is desirable to increase free-air distance 120 between adjacent pins 102. But this must be done without changing the size or the spacing of pins 102, which are dictated by the standard for connector 100 as well as by pin mechanical-strength considerations.

Figure 5:
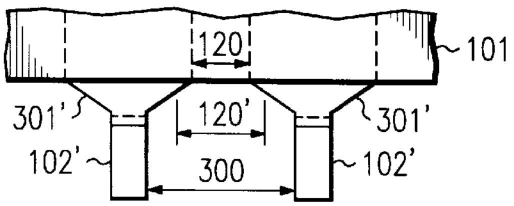
FIG. 5 is a top view of a first embodiment of adjacent pins of the connector of FIG. 1 modified according to the invention.
Figure 6:
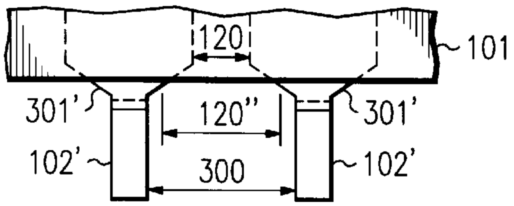
FIG. 6 is a top view of a second embodiment of adjacent pins of the connector of FIG. 1 modified according to the invention.

According to the invention, free-air distance 120 between adjacent pins 102 is increased without changing the size or the spacing of pins 102. Various ways of accomplishing this are shown in FIGS. 5–8. FIG. 5 shows a pair of adjacent pins 102' that have the portion of base 301' which extends from molding 101 shaped substantially as a triangle, monotonically tapering toward leg 300. Therefore, at all points along pin 102 the new free-air distance 120' between pins 102' is greater than or equal to distance 120. To ensure that distance 120' is always greater that distance 120 along bases 301', the tapered portion of base 301' extends into molding 101, as shown in FIG. 6. This may be accomplished either by making the tapered portion longer, or by making molding 101 thicker.

Figure 7:
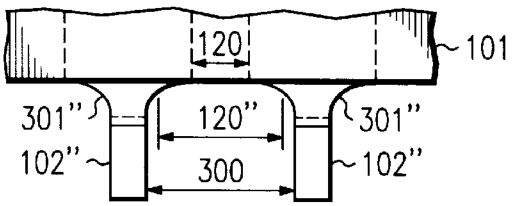
FIG. 7 is a top view of a third embodiment of adjacent pins of the connector of FIG. 1 modified according to the invention.
Figure 8:
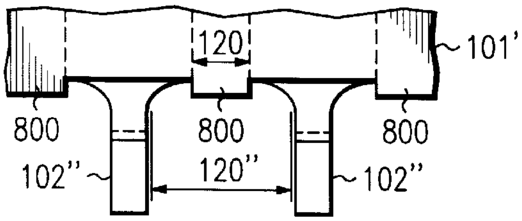
FIG. 8 is a top view of a fourth embodiment of adjacent pins of the connector of FIG. 1 modified according to the invention.

FIG. 7 shows an alternative embodiment, with a pair of adjacent pins 102" that have the portion of base 301" which extends from molding 101 concavely curved and tapering toward leg 300. Therefore, at all points along pin 102", the new free-air distance 120" between pins 102" is greater than or equal to distance 120. Moreover, at substantially all points along the tapered portion of bases 301", free-air distance 120" is greater than free-air distance 120' of the embodiment of FIG. 5. Tapered portions of bases 301" may likewise extend into molding 101 in the manner of FIG. 6. Moreover, free-air distance 120" may be further increased by using a molding 101' that has ribs 800 which extend outwardly between adjacent pins 102", as shown in FIG. 8 or the molding can be made thicker. Such a molding 101' may also be used to advantage with the embodiment of FIGS. 3–6.

Of course, various changes and modifications to the illustrative embodiments described above will be apparent to those skilled in the art. Such changes and modifications can be made without departing from the spirit and the scope of the invention and without diminishing its attendant advantages. It is therefore intended that such changes and modifications be covered by the following claims except insofar as limited by the prior art.

What is claimed is:

1. In an electrical connector for edge connecting a printed circuit board having a plurality of printed circuit paths and the electrical connector having an insulating molding and a plurality of conductive pins extending from a front surface of the molding with the front surface of the electrical connector being opposite a back surface, each pin having a base extending partly out of the front surface of the molding and a leg narrower than the base extending from the base, away from the front surface and making electrical contact with one of the plurality of printed circuit paths on the connected printed circuit board the improvement comprising:

the front surface of the molding being flat; and the base tapering to the leg along an entire length thereof between the leg and the front surface of the molding;

a free-air distance between adjacent bases of the plurality of pins a high-voltage surge rating between the adjacent bases of the plurality of pins becoming greater as a distance from the front surface along the entire length increases such that the greater free-air distance between adjacent bases provides.

2. The improvement of claim 1 wherein:

the base tapers monotonically.

3. The improvement of claim 1 wherein:

the base tapers concavely.

4. The improvement of claim 1 wherein:

the tapered length of the base extends into the molding.

* * * * *